(12) United States Patent
Sed'a et al.

(10) Patent No.: US 9,053,899 B2
(45) Date of Patent: Jun. 9, 2015

(54) METHOD FOR IMAGING A SAMPLE IN A CHARGED PARTICLE APPARATUS

(71) Applicant: FEI Company, Hillsboro, OR (US)

(72) Inventors: Bohuslav Sed'a, Blansko (CZ); Lubomír Tůma, Brno (CZ); Petr Hlavenka, Brno (CZ); Petr Sytař, Brno (CZ)

(73) Assignee: FEI COMPANY, Hillsoboro, OR (US)

( * ) Notice: Subject to any disclaimer, the term of this patent is extended or adjusted under 35 U.S.C. 154(b) by 0 days.

(21) Appl. No.: 14/294,772

(22) Filed: Jun. 3, 2014

(65) Prior Publication Data
US 2014/0361165 A1 Dec. 11, 2014

(30) Foreign Application Priority Data

Jun. 5, 2013 (EP) .................................. 13170553

(51) Int. Cl.
 *H01J 37/28* (2006.01)
 *H01J 37/20* (2006.01)
 *H01J 37/12* (2006.01)
 *H01J 37/09* (2006.01)
 *H01J 37/30* (2006.01)

(52) U.S. Cl.
CPC ....... *H01J 37/12* (2013.01); *H01J 2237/20207* (2013.01); *H01J 37/09* (2013.01); *H01J 37/3005* (2013.01); *H01J 2237/12* (2013.01)

(58) Field of Classification Search
CPC . H01J 37/12; H01J 37/20; H01J 2237/20207; H01J 2237/2806
See application file for complete search history.

(56) References Cited

U.S. PATENT DOCUMENTS

| | | | |
|---|---|---|---|
| 5,670,782 A * | 9/1997 | Sato | 250/310 |
| 7,675,049 B2 | 3/2010 | Schmidt et al. | |
| 7,872,242 B2 | 1/2011 | Boswell et al. | |
| 8,405,043 B2 | 3/2013 | Boswell et al. | |
| 8,481,962 B2 | 7/2013 | Kneedler | |
| 8,653,474 B2 | 2/2014 | Boswell et al. | |
| 8,907,305 B2 | 12/2014 | Kneedler et al. | |
| 2002/0109089 A1* | 8/2002 | Krans et al. | 250/310 |
| 2004/0211913 A1* | 10/2004 | Petrov | 250/396 R |
| 2005/0173631 A1 | 8/2005 | Ray et al. | |
| 2009/0230299 A1* | 9/2009 | Shichi et al. | 250/282 |
| 2009/0309025 A1* | 12/2009 | Preikszas | 250/311 |
| 2011/0215242 A1* | 9/2011 | Preikszas | 250/307 |

* cited by examiner

*Primary Examiner* — Michael Logie
(74) *Attorney, Agent, or Firm* — Scheinberg & Associates, PC; Michael O. Scheinberg

(57) ABSTRACT

The invention relates to a dual beam apparatus equipped with an ion beam column and an electron beam column having an electrostatic immersion lens. When tilting the sample, the electrostatic immersion field is distorted and the symmetry round the electron optical axis is lost. As a consequence tilting introduces detrimental effects such as traverse chromatic aberration and beam displacement. Also in-column detectors, detecting either secondary electrons or backscattered electrons in the non-tilted position of the sample, will, due to the loss of the symmetry of the immersion field, show a mix of these electrons when tilting the sample.

The invention shows how, by biasing the stage with respect to the grounded electrodes closest to the sample, these disadvantages are eliminated, or at least reduced.

11 Claims, 4 Drawing Sheets

METHOD FOR IMAGING A SAMPLE IN A CHARGED PARTICLE APPARATUS

The invention relates to a method of imaging a sample in a charged particle apparatus, the charged particle apparatus equipped with
- an evacuable sample chamber,
- an electron beam column for producing a finely focused beam of electrons along an electron beam axis, said electron beam column equipped with an objective lens comprising an electrostatic immersion lens,
- a focused ion beam column for producing a finely focused beam of ions along an ion beam axis,
- the focused ion beam column and the scanning electron beam column mounted on the sample chamber such that the electron beam axis and the ion beam axis intersect at an intersect position,
- a sample manipulator showing a conductive plane equipped with means for holding the sample, the sample manipulator capable to tilt said plane between a first tilt angle in which the plane is perpendicular to the electron beam axis and a second tilt angle in which the plane is perpendicular to the ion beam axis, the method comprising
- mounting the sample on the plane of the sample manipulator,
- directing a beam of finely focused electrons to the sample with the electron beam column,
- directing a beam of ions to the sample with the focused ion beam column Such a method is used, for example, to machine a sample or to excavate a sample from a work piece, such as a semiconductor wafer, with the ion beam column—acting as a Focused Ion Beam (FIB)—and to examine the sample with the electron beam column—acting as a Scanning Electron Microscope (SEM)—.

The known patent describes a system with a scanning electron microscope column, said SEM column equipped with an objective lens that comprises an electrostatic immersion lens and a magnetic lens. The described system is further equipped with a focused ion beam column with an electrostatic non-immersion lens.

For a good SEM image it is required that the electric immersion field shows symmetry around the electron optical axis, as otherwise transverse chromatic aberration and several geometric aberrations of the electron beam will occur. Preferably the sample stage is therefore oriented perpendicular to the electron beam axis, thus operating the apparatus in a positional configuration resembling a standard SEM.

When using the FIB, the ions often need to impinge on the sample or wafer almost perpendicular, and thus the electron beam impinges slanted to the sample or wafer.

In any case the ions have to travel from the ion columns objective lens to the intercept point, and the ions thus have to travel through the electric immersion field. This result in transverse chromatic aberration and several geometric aberrations of the ion beam. For a good ion positioning/imaging the electrostatic immersion field of the SEM column should be turned off.

The known patent finds a solution in a shield electrode between SEM column and FIB column, and biasing the electrode of the electrostatic immersion lens closest to the sample with respect to sample and ion beam column and/or biasing the shield.

The solution of the known patent relies on restoring the rotational symmetry of the electrostatic immersion field around the electron beam axis when the sample is tilted by biasing the electrode of the SEM objective lens closest to the sample with respect to the sample, and shaping the part of the field that has to be traversed by the ion beam by the shield electrode, to allow "good focusing and beam guidance for both of the electron beam and also the ion beam".

A disadvantage of the known solution is that a shielding electrode has to be added in the region near the sample. As known to the person skilled in the art this area is often cluttered with accessories, like radiation detectors (secondary electron detectors, backscattered electron detectors, X-ray detectors), one or more gas injection systems, manipulators for attaching the sample to, etc.

The invention intends to provide an alternative solution without adding a shielding electrode.

To that end the method according to the invention is characterized in that the electron beam column and the focused ion beam column each show an electrode closest to the intersect position, said electrodes connected to a common potential, and the plane to which the sample is mounted is biased with respect to these electrodes to such an extent that, depending on the tilt angle, the ion beam and the electron beam intersecting the intersect position without showing transverse chromatic aberration, and the intersect of the beams is at the same sample position for both tilt positions.

According to the invention the electrodes of the two objective lenses are connected to a common potential (preferably earth), without extra electrodes attached to one or both of them. The stage is connected to a voltage source, that is capable of biasing the stage and the sample mounted on it with respect to the columns. As a result of this the following problems can be countered:
- the beam shift resulting on sample tilt and excitation of the electron column's electrostatic lens can be compensated,
- The chromatic aberration of both columns can be compensated, The bias of the electrodes with respect to the sample is preferable zero when the electron beam impinges vertically to the sample In a preferred embodiment the two columns are under an oblique angle with respect to each other of between 45 and 60 degrees.

Apparatuses with an electron beam column and an ion beam column under an angle with respect to each other are well known, showing an angle of, for example, 52 degrees between the two columns.

In another embodiment the vacuum chamber comprises one or more electrically conductive parts that are equipped to be biased with respect to the sample and the electrodes.

In a further embodiment at least one of the one or more electrically conductive parts can be positioned with respect to the electrodes and the sample.

In another embodiment the one or more parts comprises a part from the group of Gas Injection Systems, secondary electron detectors, backscattered electron detectors, charged particle detectors, X-ray detectors, or camera's, When using for example a Gas Injection System (GIS) or a micromanipulator, these are in operation moved with respect to the sample and column. By suitable biasing the sample, a first-order correction for the disturbances caused by the varying position of these metallic (thus: conductive) parts is possible.

In a preferred embodiment the electron beam column comprises an in-column charged particle detector, more specifically an in-lens charged particle detector.

Such in-column detectors are used to achieve a high efficiency. Inventors found that the use of the method resulted in detection of secondary electrons (SE's) and backscattered electrons (BSE's) without adverse deflection. Deflection would lead to a lower detection efficiency. Also, might the detectors also be constructed to detect angular symmetry round the electron-optical axis, the deflection would hinder such angular dependent detection.

It is noted that, due to the polarity of the electrostatic field, such a detector is typically used for detecting BSE's and SE's, and will not be effective for detecting positively charged ions The invention is now elucidated using figures, in which identical reference numerals refer to corresponding features. To that end:

FIG. 1 schematically shows a dual beam system equipped to carry out a method according to the present invention.

FIG. 2 schematically shows a part of the dual beam system of FIG. 1

FIGS. 3A, 3B, 3C, 3D, 3E and 3F show photomicrographs obtained during experiments with the method according to the invention.

FIG. 1 depicts an exemplary dual beam SEM/FIB system 100 that is equipped to carry out a method according to the present invention. Suitable dual beam systems are commercially available, for example, from FEI Company, Hillsboro, Oreg., the assignee of the present application. While an example of suitable hardware is provided below, the invention is not limited to being implemented in any particular type of hardware.

The dual beam system 100 has a vertically mounted electron beam column 101 and a focused ion beam (FIB) column 102 mounted at an angle of approximately 52 degrees from the vertical on an evacuable sample chamber 103. The sample chamber may be evacuated by e.g. a turbo-molecular pump, or other known pumping means such as oil diffusion pumps, ion getter pumps, scroll pumps, etc. (not shown).

The electron beam column 101 comprises an electron source 110 for producing a beam of electrons 112. Electron-optical condenser lenses $114^a$, $114^b$ and objective lens 116 are used to finely focus the beam of electrons on a sample 104. Objective lens 116 comprises an electrostatic immersion lens, and preferably also a magnetic lens, so that the beam of electrons 112 is focused by both the electrostatic immersion field and the magnetic field. The beam of electrons can be positioned on and can be scanned over the surface of a sample (also known as substrate) 104 by means of deflections coil $118^a$ and $118^b$. It is noted that lenses and deflection unit may use electric fields to manipulate the electron beam, or that magnetic fields may be used, or a combination thereof.

Dual beam system 100 also includes focused ion beam (FIB) column 102 which comprises an ion source 120 for producing a beam of ions. Ion-optical condenser lenses $124^a$, $124^b$ and objective lens 126 are used to finely focus the beam of ions onto the sample 104. The beam of ions can be positioned on and scanned over the surface of the sample 104 by means of deflectors $128^a$ and $128^b$. Due to the nature of ions (mass over charge ratio) the lenses and deflectors are typically electrostatic in nature.

Electron beam 112 and ion beam 122 can be focused onto sample 104, which is mounted on a flat side of a sample manipulator in the form of a movable X-Y-Z stage 105 within vacuum chamber 103.

Column 101 and 102 are aligned to form an intersect 106 between ion beam 122 and electron beam 112. Preferably the sample is positioned at this intersect.

Mounted on the vacuum chamber is a (retractable) Gas Injection System (GIS) 142. The GIS comprises a reservoir (not shown) for holding the precursor material and a needle 144 for directing the precursor material to the surface of the substrate. The GIS further comprises means for regulating the supply of precursor material to the substrate. In this example the regulating means are depicted as an adjustable valve 143, but the regulating means may also take the form of e.g. controlled heating of the precursor material.

Mounted on the vacuum chamber is further a retractable and positional micromanipulator 145, comprising a tip 146 with a distal end located in the vacuum chamber. The distal part of tip 146 is for example used to probe the sample, or to adhere a (part of) the sample using, for example, Beam Induced Deposition (either using ion-, electron- or laser beams).

When the electrons in the electron beam strike sample 104, secondary electrons (SE's) and backscattered electrons (BSE's) are emitted. SE's are often defined as electrons emitted from the sample with an energy of less than 50 eV, while BSE's are often defined as electrons emitted from the sample with an energy in excess of 50 eV. At least part of the SE's and BSE's are detected by electron detector 140, such as an Everhard-Thornley detector, or an in-column detector mounted in-column, more preferably mounted within objective lens 116, the detector capable of detecting low energy electrons and backscattered electrons. It is noted that such a detector can be scintillator based or can be formed as semiconductor devices, and that such a detector can be segmented or not It is noted that, beside SE's and BSE's, also other types of radiation are emitted, such as X-rays, visible light, etc. These types of radiation may also be detected using appropriate detectors.

The signals of the detectors are fed to a system controller 130. Said system controller also controls the deflector signals, lenses, electron source, GIS, stage and pump(s), and other items of the instrument, including GIS system 142 and micromanipulator 145. The system controller can thus direct both the ion beam and the electron beam to specific locations on the sample, either using scan patterns or steady state deflection more. Using the positional information of the beam, and using the information of the detectors, the controller can form an image of the sample on the monitor.

It is noted that the system controller also controls the detectors, for example by controlling their gain.

It is noted that the in-column detector 141 shows a central through hole for passing the beam of electrons 112.

It is noted that a detector such as detector 140 can be positional in the vacuum chamber, either to optimize detection efficiency or to make space for other parts during certain observation, the observations for example demanding another type of detector.

Stage 105 can support a sample and/or one or more TEM sample holders so that a minute part of a sample can be extracted from the sample and moved to a TEM sample holder. Stage 105 can preferably move in a horizontal plane (X and Y axes) and vertically (Z axis). Stage 105 can also tilt approximately sixty (60) degrees or more and rotate about the Z axis. In some embodiments, a separate TEM sample stage (not shown) can be used.

Pumps are used to evacuate the electron beam column 101, the ion beam column 102 and the vacuum chamber 103. The vacuum pumps typically provides within chamber 103 a vacuum of approximately $3 \times 10^{-6}$ mbar. When a suitable precursor gas is introduced onto the sample surface, the chamber background pressure may rise, typically to about $5 \times 10^{-5}$ mbar. However, it is known to use pressures as high as 1-10 mbar, enabling the observation and "machining" of wet samples.

The micromanipulator 145, such as the AutoProbe 200™ from Omniprobe, Inc., Dallas, Tex., or the Model MM3A from Kleindiek Nanotechnik, Reutlingen, Germany, can precisely move objects within the vacuum chamber. The micromanipulator may comprise precision electric motors positioned outside the vacuum chamber to provide X, Y, Z, and theta control of a distal end positioned within the vacuum chamber. The micromanipulator can be fitted with different end effectors for manipulating small objects. In the embodiments described herein, the end effector is a thin probe. As is known in the prior art, a micromanipulator (or microprobe) can be used to transfer a TEM sample (which has been freed from a substrate, typically by an ion beam) to a TEM sample holder for analysis.

Voltage source 134 is connected to stage 105, enabling the stage to electrically "float" at a predetermined voltage with respect to the potential of the vacuum chamber and the electrodes of the columns closest to the stage. This voltage source is under control of system controller 130 and can thus set to the appropriate voltage to optimize the electric symmetry of the electrostatic part of objective lens 116 round the electron beam 112, thereby minimizing transverse chromatic aberration, keeping the intersect position 106 at a fixed position, etc, independent on the tilt of the sample and the stage.

FIG. 2 schematically shows the objective lenses of the two columns and the intersect of the ion beam and the electron beam.

The electron column 101 ends in an objective lens 116 comprising an immersion lens, formed by electrode 202, the grounded electrode 204 forming the end cap of the electron column closest to the intersect, and the electrode 201 that is formed by the flat surface of the stage 105. The grounded electrode 204 is also part of a magnetic circuit that is magnetically excited by coil 206. The detector 141 has a conductive plane, for example formed by a metallization layer, facing the sample and forming part of the electrode 202.

The focused ion beam column 102 ends in an objective lens 126 lens formed by electrodes 208, 210 and 212, the electrodes 208 and 212 connected to ground and electrode 210 typically at a voltage decelerating the ion beam. It is noted that it is known to use an accelerating voltage when using low-energy ions. Grounded electrode 212 is the electrode of the focused ion beam column closest to the sample.

It is mentioned that it is possible to have an in-column detector discriminating between the energy of the electrons, or the angle under which electrons enter the electron columns' objective lens. Note that the low energy SE's are parallelized along the electron beam axis due to the immersion field and are kept near the axis, while for BSE's this happens to a lesser degree due to their higher initial energy. By obtaining the information of both signals separately it is possible to get images with mainly SE information or mainly BSE information. Inventors experimented with a set-up where such images could be obtained.

FIG. 3A shows an image of tin balls obtained using an in-lens SE detector.

FIG. 3B shows an image of tin balls obtained using an in-lens BSE detector.

Figure 1:
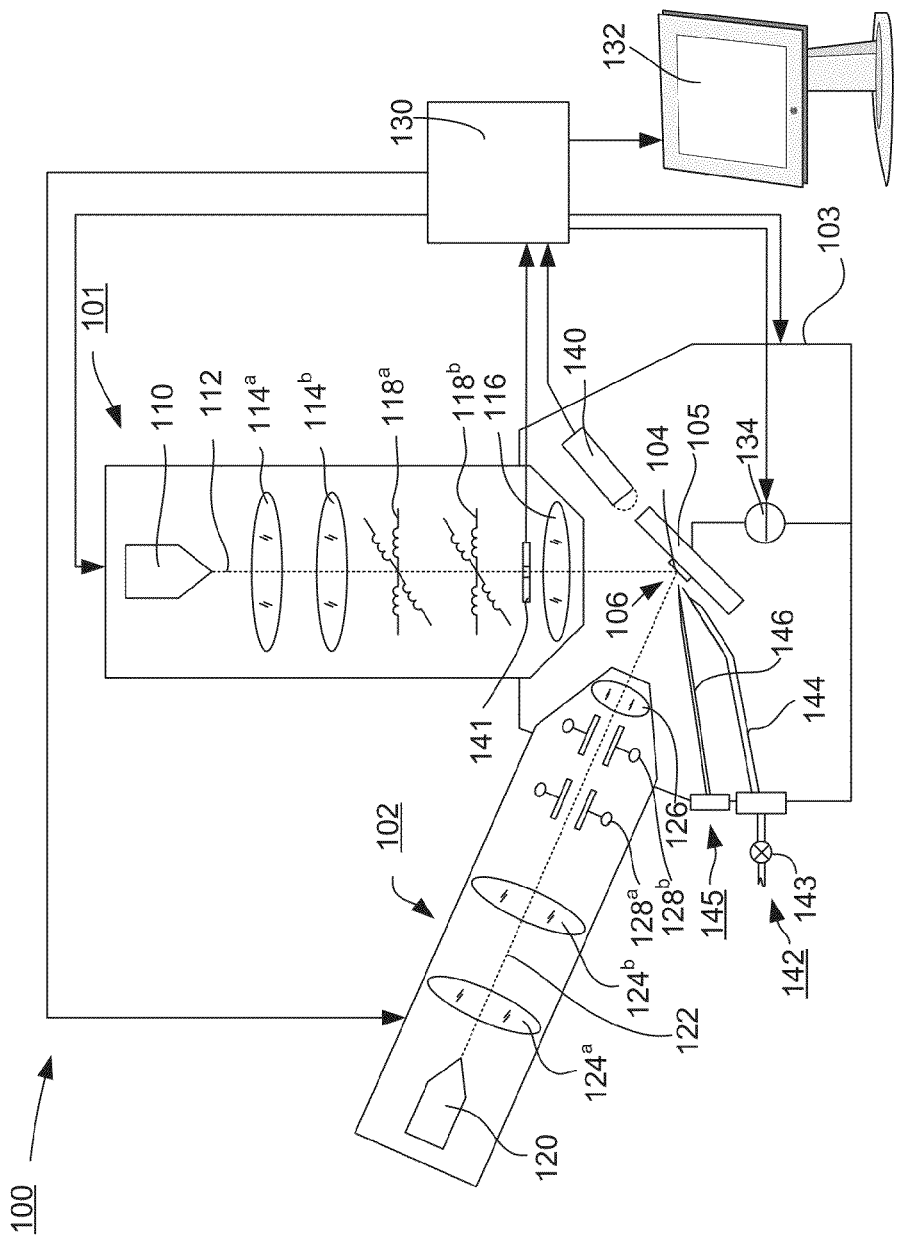
Figure 2:
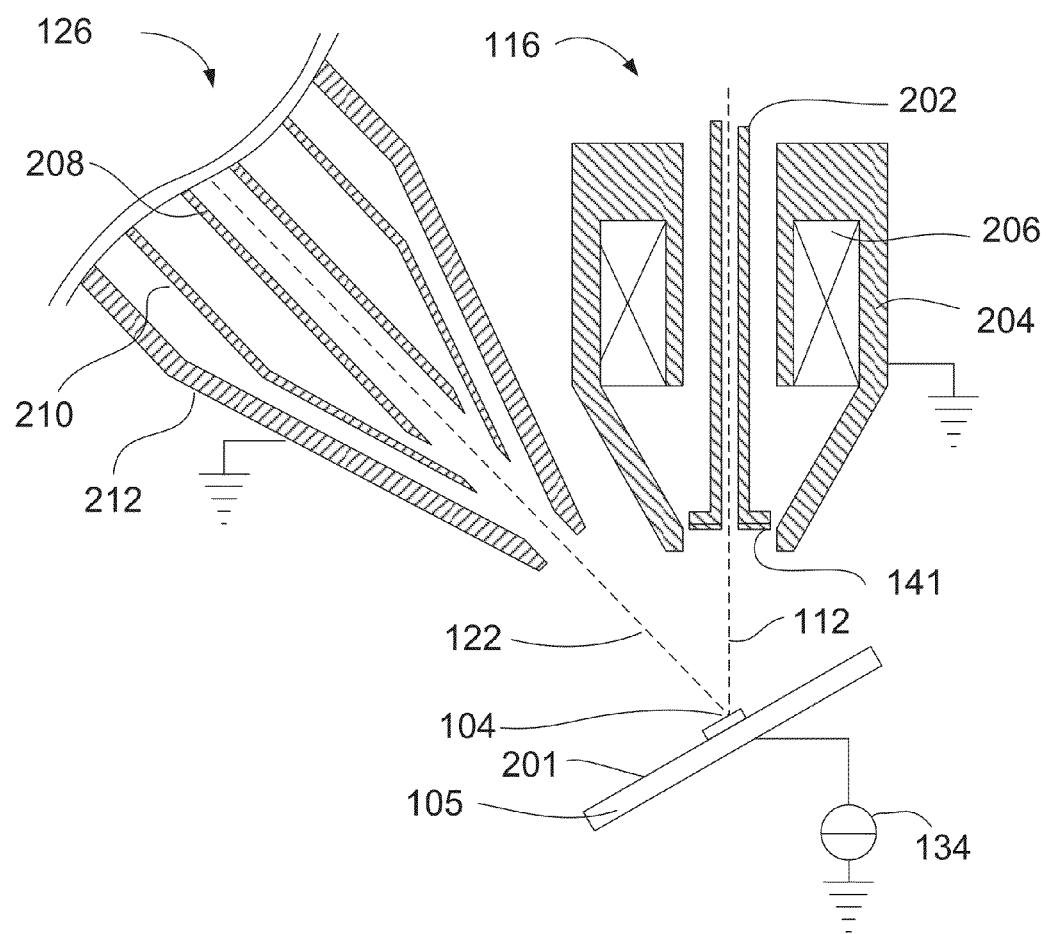
Figure 3A:
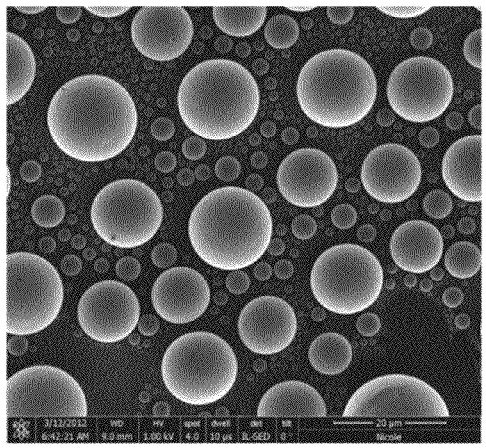
FIGS. 3A, 3B, 3C, 3D, 3E and 3F show photomicrographs obtained during experiments with the method according to the invention.
Figure 3B:
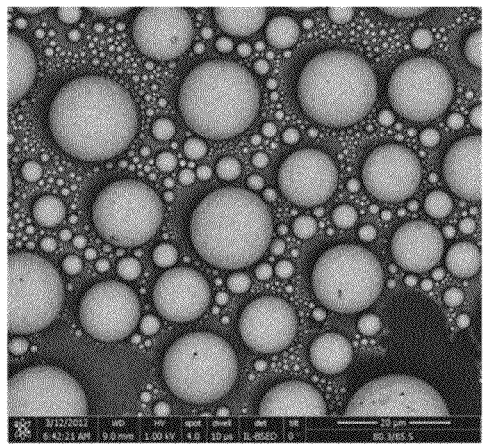
Figure 3C:
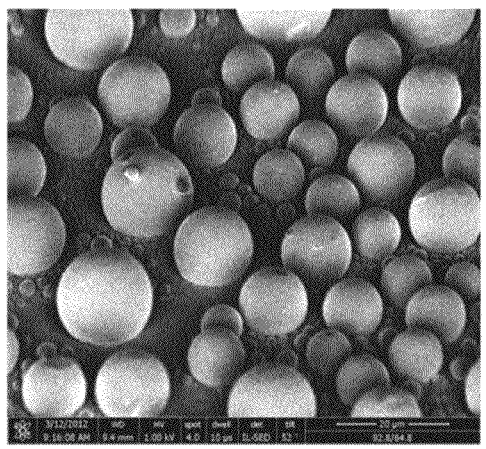
Figure 3D:
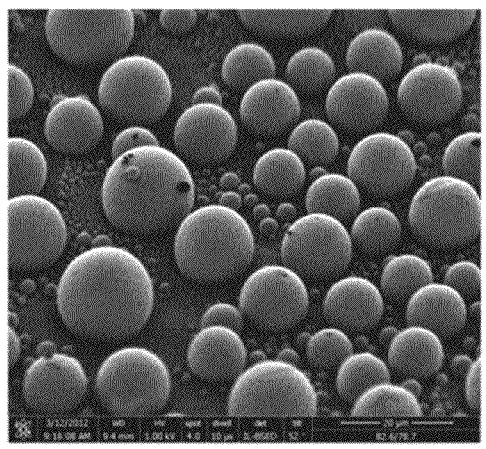
Figure 3E:
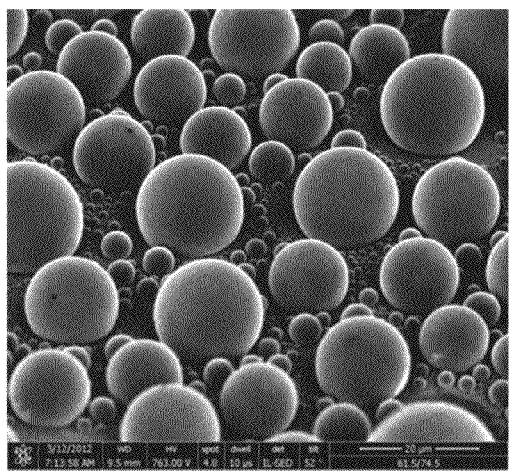
Figure 3F:
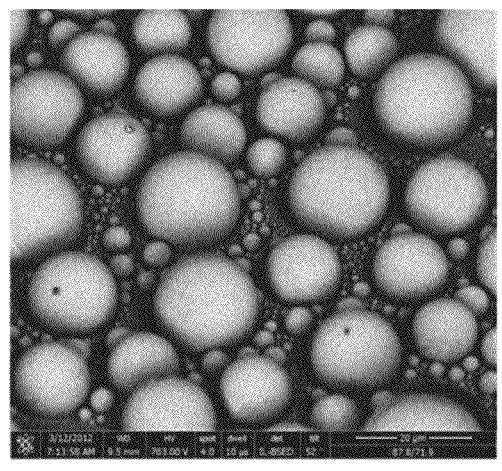

FIG. 3C shows an image of tin balls obtained using the in-lens SE detector when the sample stage was tilted 52 degrees FIG. 3D shows an image of tin balls obtained using the in-lens BSE detector when the sample stage was tilted 52 degrees FIG. 3E shows an image of tin balls obtained using the in-lens SE detector when the sample stage was tilted 52 degrees and a stage bias of 234 volt was applied FIG. 3F shows an image of tin balls obtained using the in-lens BSE detector when the sample stage was tilted 52 degrees and a stage bias of 234 volt was applied It is mentioned that tin balls are often used as reference specimen. The images were obtained with the sample (tin balls) at the intersect position, the intersect in that case 10 mm removed from the electrode 204, the voltage on electrode 202 approximately 8 kV and the landing energy of the electrons on the sample 1 keV.

The image shown in FIGS. 3A and 3B are what the skilled person would expect from an SE or BSE image, respectively.

The images of FIGS. 3C and 3D look quite different from FIGS. 3A and 3B, respectively. These images contain mixed information (BSE+SE), and show anisotropy in the signal, the amount of SE and BSE signal depending on the orientation of the displayed sample surface with respect to the tilt axis. For example the edge effect on the tin balls is pronounced different in different directions. The tilt thus causes an image change and a signal distortion. The signal distortion is caused by the SE's first accelerated perpendicular to the flat of the stage and only afterwards accelerated towards the detector. When directing the SE towards the detector, they thus already had a large energy hindering parallelization.

The images of FIGS. 3E and 3F, although looking different from the FIGS. 3A and 3B as a consequence of the tilting (image change), are again what the skilled person would expect from an SE or BSE image, respectively (no signal distortion anymore).

By restoring the symmetry round the electron optical axis, not only transverse chromatic aberration and beam displacement are reduced or eliminated, but also the entanglement of the information of BSE's and SE's is thus reduced.

We claim as follows:

1. A method of imaging a sample in a charged particle apparatus, the charged particle apparatus comprising:
   an evacuable sample chamber,
   an electron beam column for producing a finely focused beam of electrons along an electron beam axis, said electron beam column equipped with an objective lens comprising an electrostatic immersion lens,
   a focused ion beam column for producing a finely focused beam of ions along an ion beam axis, the focused ion beam column and the electron beam column mounted on the sample chamber such that the electron beam axis and the ion beam axis intersect at an intersect position,
   a sample manipulator having a conductive plane equipped with means for holding the sample, the sample manipulator capable to tilt said plane between a first tilt angle in which the plane is perpendicular to the electron beam axis and a second tilt angle in which the plane is perpendicular to the ion beam axis,
   the method comprising:
   mounting the sample on the plane of the sample manipulator,
   directing a beam of finely focused electrons to the sample with the electron beam column,
   directing a beam of ions to the sample with the focused ion beam column, wherein:
   the electron beam column has an electrode closest to the intersect position and the focused ion beam column shows an electrode closest to the intersect position, said electrodes connected to a common potential, and the plane to which the sample is mounted is electrically biased with respect to the electrodes to such an extent that, depending on the tilt angle, the ion beam and the electron beam intersect at the intersect position without showing transverse chromatic aberration, and the intersection of the beams is at the same position for both tilt positions.

2. The method of claim 1 in which the tilt angle dependent bias is zero if the plane is perpendicular to the electron beam axis.

3. The method of claim 2 in which the difference between the first tilt angle and the second tilt angle is between 45 and 60 degrees.

4. The method of claim 1 in which the difference between the first tilt angle and the second tilt angle is between 45 and 60 degrees.

5. The method of claim 1 in which the vacuum chamber comprises one or more electrically conductive parts that are equipped to be biased with respect to the sample and the electrodes.

6. The method of claim 5 in which at least one of the one or more electrically conductive parts can be positioned with respect to the electrodes and the samples.

7. The method of claim 5 in which the one or more parts comprises a part from the group of Gas Injection Systems, manipulators, secondary electron detectors, backscattered electron detectors, charged particle detectors, X-ray detectors, or cameras.

8. The method of claim 1 in which the electron beam column comprises an in-column charged particle detector.

9. The method of claim 8 in which the in-column detector is an in-lens detector.

10. The method of claim 9 in which the in-column detector is equipped to distinguish between secondary electrons and backscattered electrons.

11. The method of claim 8 in which the in-column detector is equipped to distinguish between secondary electrons and backscattered electrons.

\* \* \* \* \*